United States Patent [19]

Ogasawara et al.

[11] Patent Number: 5,705,770
[45] Date of Patent: Jan. 6, 1998

[54] THERMOELECTRIC MODULE AND METHOD OF CONTROLLING A THERMOELECTRIC MODULE

[75] Inventors: Kenji Ogasawara; Keisuke Tsubata, both of Chiba, Japan

[73] Assignee: Seiko Instruments Inc., Japan

[21] Appl. No.: 503,820

[22] Filed: Jul. 18, 1995

[30] Foreign Application Priority Data

Jul. 21, 1994 [JP] Japan ................. 6-169730

[51] Int. Cl.$^6$ .............. H01L 35/10; G04G 1/00; H02J 3/32
[52] U.S. Cl. .............. 136/205; 136/211; 136/212; 136/224; 136/225; 136/242; 307/48; 307/71; 310/306; 320/4; 320/39; 320/61; 368/64; 368/66; 368/203; 368/204
[58] Field of Search .............. 136/200, 205, 136/211, 212, 224, 225, 242; 310/306; 320/2, 3, 4, 16, 17, 39, 61; 307/48, 71, 72; 368/64, 66, 203, 204

[56] References Cited

U.S. PATENT DOCUMENTS

| | | |
|---|---|---|
| 4,106,279 | 8/1978 | Martin ................. 58/23 BA |
| 4,165,477 | 8/1979 | Comte ................. 320/61 |
| 4,213,292 | 7/1980 | Dolezal et al. ................. 368/204 |
| 4,320,477 | 3/1982 | Baumgartner ................. 368/64 |

*Primary Examiner*—T. Tung
*Assistant Examiner*—Chrisman D. Carroll
*Attorney, Agent, or Firm*—Adams & Wilks

[57] ABSTRACT

A thermoelectric module includes a switching circuit for switching the connection between a first thermoelectric element and a second thermoelectric element between series connection and parallel connection, a voltage detecting circuit for controlling the switching circuit by detecting the voltage of the second thermoelectric element, and a storage battery circuit for storing electricity utilizing the voltages generated by the first thermoelectric element and the second thermoelectric element connected by the switching circuit. A voltage generated from an applied temperature difference is detected by the voltage detecting circuit. If there is a sufficient temperature difference, the first thermoelectric element and second thermoelectric element are connected in parallel by the switching circuit to charge the electricity in the storage battery circuit using the doubled current. If there is no sufficient temperature difference, the first thermoelectric element and second thermoelectric element are connected in series by the switching circuit.

21 Claims, 9 Drawing Sheets

THERMOELECTRIC MODULE AND METHOD OF CONTROLLING A THERMOELECTRIC MODULE

BACKGROUND OF THE INVENTION

The present invention relates to a thermoelectric module and to a method of controlling a thermoelectric module which allows a storage battery circuit to charge electricity efficiently.

Heretofore, many electronic devices have employed a battery as a primary energy source. A user must always be mindful about the possibility that the battery may die during operation of the apparatus and, if the battery dies during operation, there may be serious damage. The user must replace the dead battery with a new one. If the user can not replace the battery, he or she must have the battery replaced by an outside source such as an electrical appliance store. In addition, since a used battery can be a source of environmental pollution, it can not be disposed of in the same manner as ordinary waste.

In search of a source of energy to replace batteries, research has recently focused on thermoelectric elements which generate electromotive force utilizing the Seebeck effect.

Figure 9:
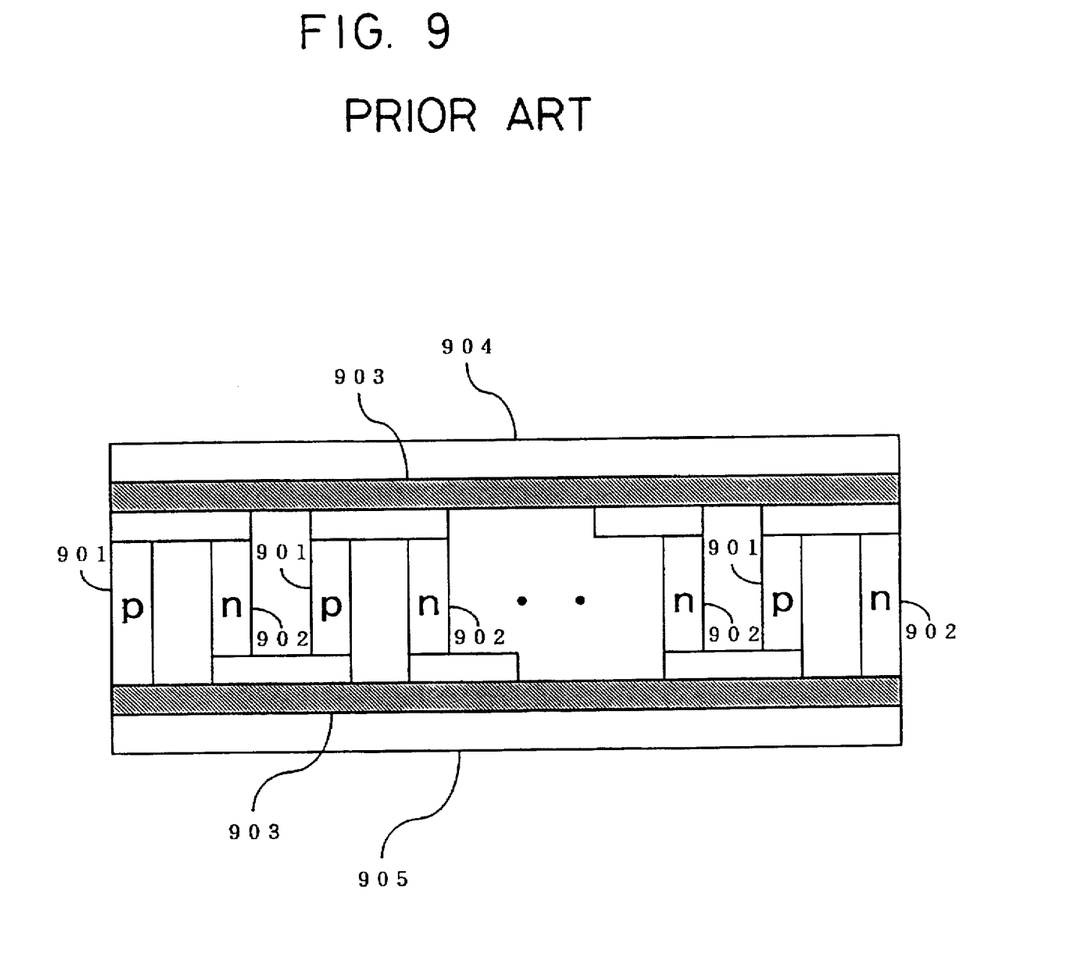
FIG. 9 illustrates the principle of the generation of electricity of a conventional thermoelectric generator.

For example, FIG. 9 illustrates the principle of the generation of electricity performed by a thermoelectric generator, or element. The thermoelectric generator is comprised of a multiplicity of p-type semiconductor members 901 and n-type semiconductor members 902 connected in series, an insulator 903, a radiator 904, and a heat sink 905. For example, such a thermoelectric generator is disclosed in Japanese unexamined patent publication (Kokai) No. S54-123047(1979).

However, the voltage generated by a thermoelectric generator depends on a temperature difference applied to the semiconductor members. Therefore, a desired voltage can not be obtained if there is not a sufficient temperature difference, while an unnecessarily high voltage is generated if there is too great a temperature difference.

SUMMARY OF THE INVENTION

It is an object of the present invention to provide a thermoelectric module to allow a storage battery circuit to store electricity efficiently.

It is another object of the present invention to provide a method of controlling a thermoelectric module to allow a storage battery circuit to store electricity efficiently.

In order to achieve the objects, the thermoelectric module utilizes a plurality of thermoelectric elements that are selectively connected in series or in parallel in response to a voltage generated by the plurality of thermoelectric elements under an applied temperature difference.

The thermoelectric module of the present invention includes a switching circuit for switching the connection between a first thermoelectric element and a second thermoelectric element between series connection and parallel connection, a voltage detecting circuit for controlling the switching circuit by detecting the voltage of the second thermoelectric element, and a storage battery circuit for storing electrical energy generated by the first thermoelectric element and the second thermoelectric element connected by the switching circuit.

The switching circuit connects the first thermoelectric element and the second thermoelectric element in series or in parallel based on the detection of a voltage generated by an applied temperature difference performed by the voltage detecting circuit.

The thermoelectric module of the present invention always allows the storage battery circuit to charge electricity efficiently.

Figure 8:
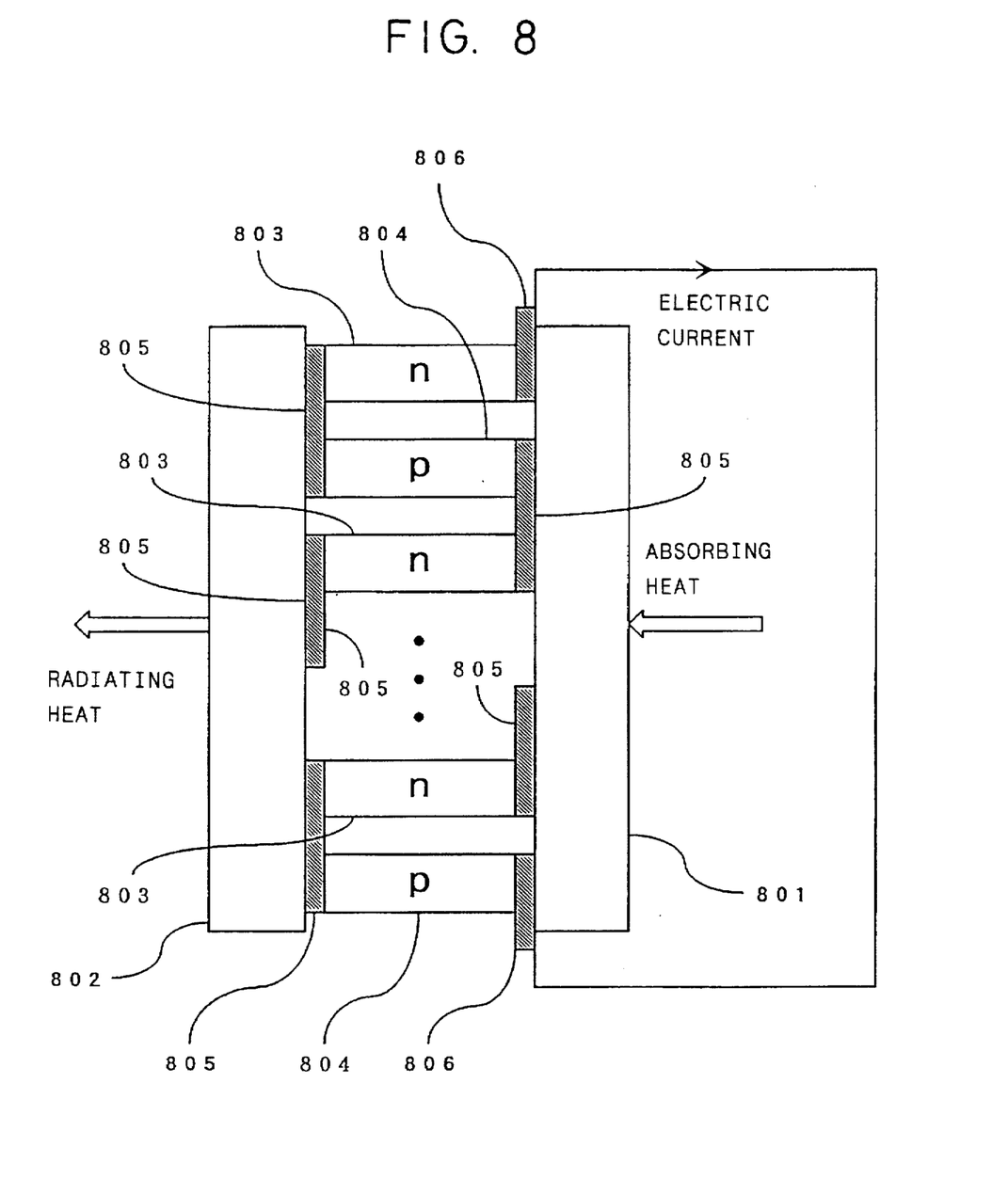
FIG. 8 illustrates a configuration of a thermoelectric element used for the present invention.

FIG. 8 illustrates the principle of the generation of electricity and the structure of a thermoelectric element.

Assume a first insulator 801 to be an absorbing side and a second insulator 802 to be a radiating side. Then, if there is a temperature difference between both sides such that the temperature of the absorbing side is higher than that of the radiating side, the heat is transferred from the first insulator 801 to the second insulator 802. During this process, electrons in n-type semiconductors 803 move toward the insulator 802 on the radiating side while holes in p-type semiconductors 804 move toward the insulator 802 on the radiating side.

Since the n-type semiconductors 803 and the p-type semiconductors 804 are electrically connected in series through connectors 805, the transfer of heat is converted into a current which produces an electromotive force at output terminal portions 806 on both ends.

DETAILED DESCRIPTION OF THE PREFERRED EMBODIMENTS

The present invention will now be described in detail with reference to the drawings.

Figure 1:
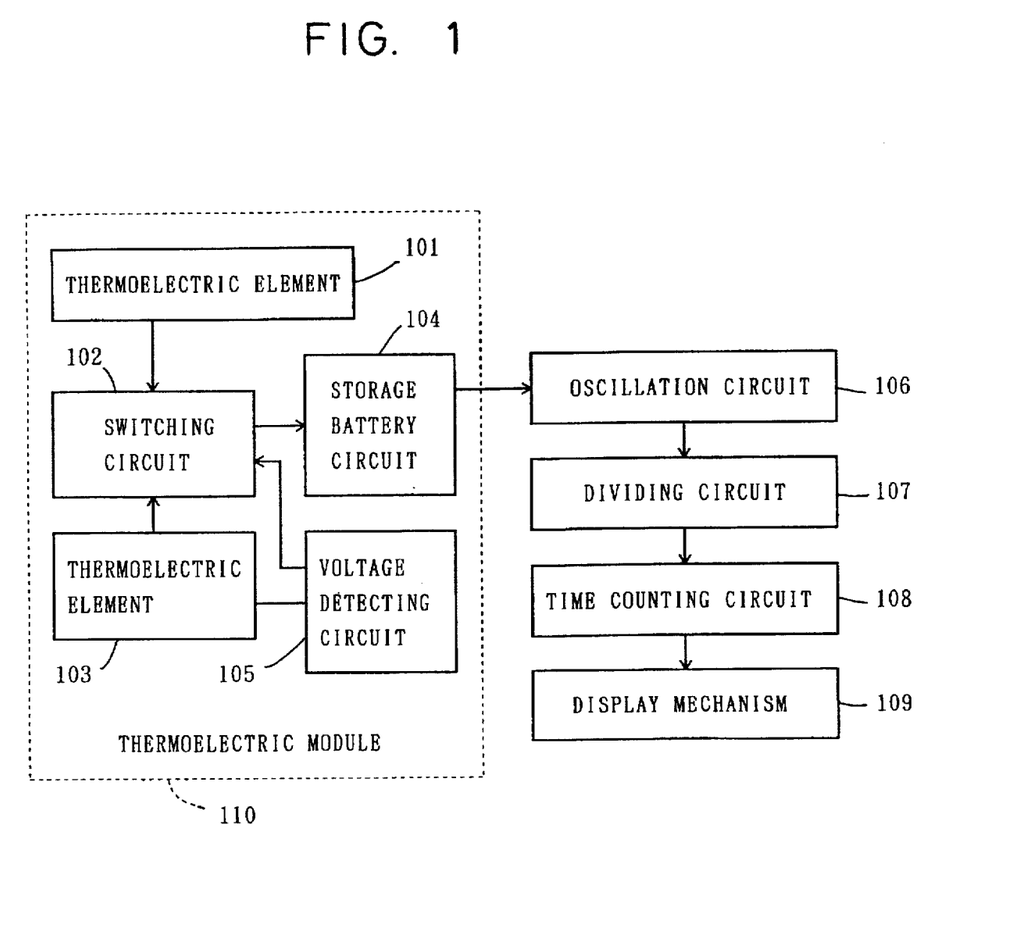
FIG. 1 is a functional block diagram showing an example of a typical configuration of a thermoelectric module according to the present invention.

FIG. 1 is a block diagram showing an example of a typical configuration according to the present invention including a switching circuit 102 for switching the connection between a first thermoelectric element 101 and a second thermoelectric element 103 between series connection and parallel connection, a voltage detecting circuit 105 for controlling the switching circuit 102 by detecting the voltage of the second thermoelectric element 103, and a storage battery circuit 104 for storing electrical energy generated by the first thermoelectric element 101 and the second thermoelectric element 103 connected by the switching circuit 102. A voltage generated by a temperature difference is detected by the voltage detecting circuit 105.

Since a desired voltage is obtained if there is a sufficient temperature difference, the first thermoelectric element 101 and the second thermoelectric element 103 are connected in parallel by the switching circuit 102 to store the electricity in the storage battery circuit 104 using the doubled current. If therein is not a sufficient temperature difference, the first thermoelectric element 101 and the second thermoelectric element 103 can be connected in series by the switching circuit 102 to obtain the desired voltage.

In the case of an electronic timepiece, the timepiece has an energy source 110 of the type described above and an oscillation circuit 106, a dividing circuit 107, a time counting circuit 108, and a display mechanism 109. The storage battery circuit 104 applies electric energy stored therein to the oscillation circuit 106, which outputs a reference signal to the dividing circuit 107. The dividing circuit 107 frequency-divides the reference signal and output a divided signal to the time counting circuit 108. The time counting circuit 108 counts time based upon the divided signal output by the dividing circuit 107. The display mechanism 109 receives the time information output by the time counting circuit 108 and displays the time.

(1) First Embodiment

Figure 2:
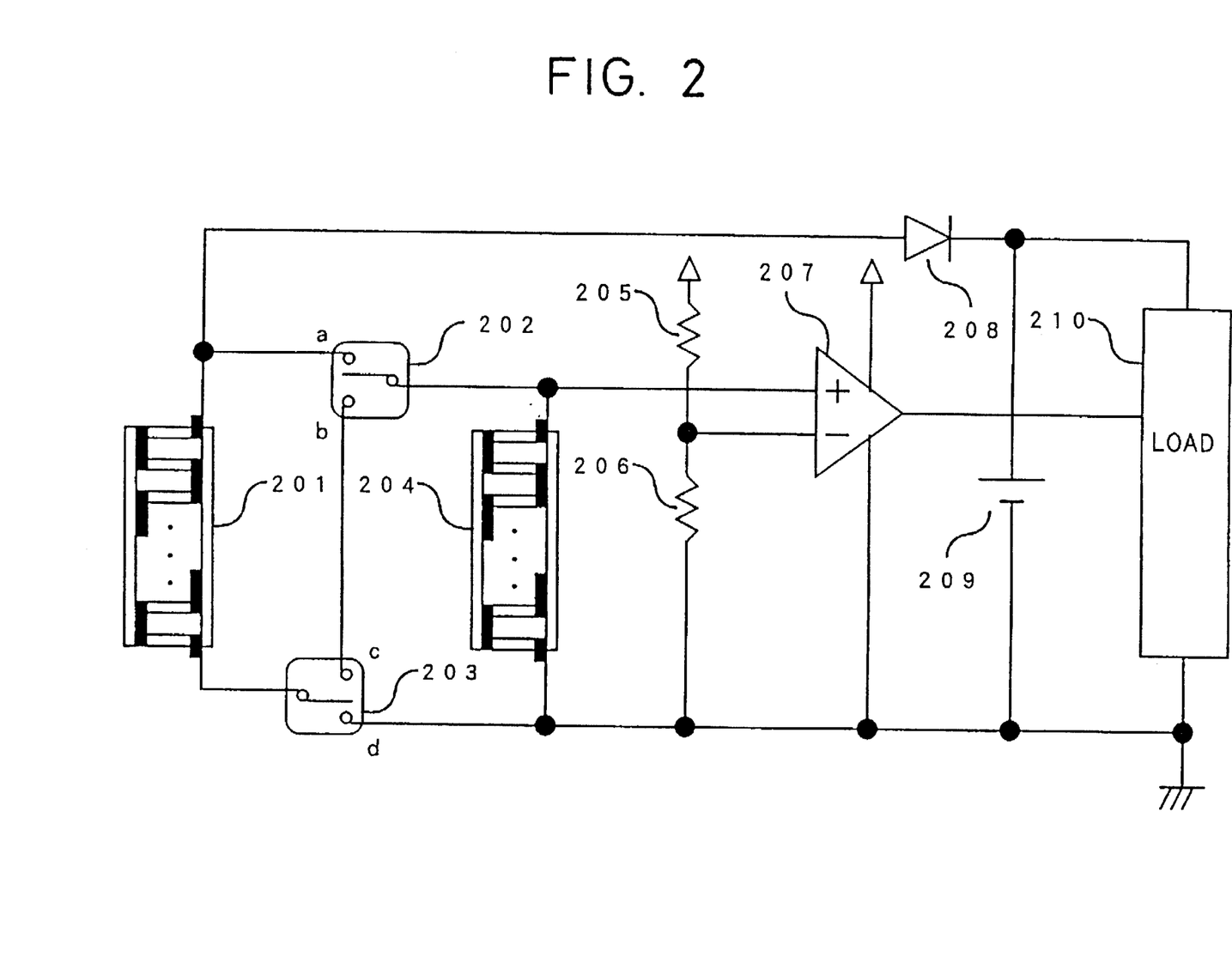
FIG. 2 is a circuit diagram showing a first embodiment of a thermoelectric module according to the present invention.

FIG. 2 is a circuit diagram showing a first embodiment of the present invention.

A first thermoelectric element 201 and a second thermoelectric element 204 generate a voltage in response to a temperature difference between an absorbing side and a radiating side of each thermoelectric element. These thermoelectric elements are connected to each other by switching circuits 202 and 203 constituted by MOS switches, transmission gates, or the like.

The first thermoelectric element 201 and second thermoelectric element 204 are connected in parallel by connecting the switching circuit 202 to terminal a and switching circuit 203 to terminal d, respectively. The first thermoelectric element 201 and second thermoelectric element 204 are connected in series by connecting the switching circuit 202 to terminal b and switching circuit 203 to terminal c, respectively.

A comparator 207 compares a generated voltage by the second thermoelectric element 204 with a reference voltage generated according to the dividing ratio of resistors 205 and 206, and detects whether the thermoelectric elements can sufficiently charge a secondary battery 209 constituted by a vanadium lithium secondary battery, a manganese lithium secondary battery or the like. The secondary battery 209 stores the voltage generated by the first thermoelectric element 201 and the second thermoelectric element 204 through a reverse-flow blocking diode 208, and supplies an electric power to a load 210.

The switching circuits 202 and 203 and the comparator 207 are controlled by a microcomputer which is included in the load 210. The operation of the microcomputer is illustrated in the flow chart shown in FIG. 3.

Figure 3:
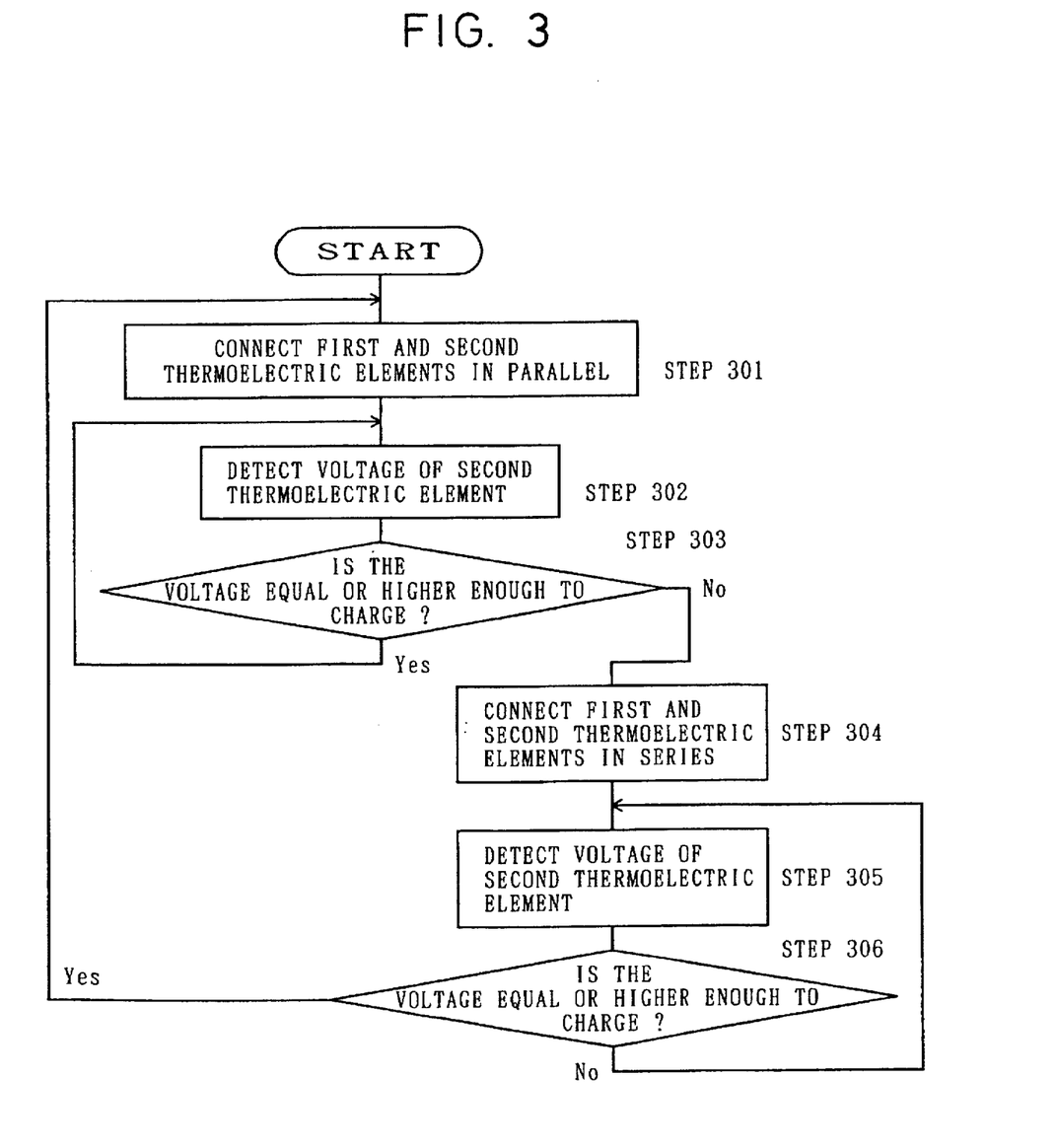
FIG. 3 is a flow chart showing the first embodiment of a thermoelectric module according to the present invention.

The first thermoelectric element and the second thermoelectric element are connected in parallel by the switching circuits (step 301).

The voltage of the second thermoelectric element is detected (step 302).

If the voltage of the second thermoelectric element is equal to or higher than the voltage which can be charged in the secondary battery, the operation at step 302 is performed. If the voltage is lower than the voltage which can be charged, the operation at step 304 is performed (step 303).

If the voltage of the second thermoelectric element is lower than the voltage which can be charged in the secondary battery, the first thermoelectric element and the second thermoelectric element are connected in series by the switching circuits (step 304).

The voltage of the second thermoelectric element is detected (step 305). If the voltage of the second thermoelectric element is equal to or higher than the voltage which can be charged in the secondary battery, the operation at step 302 is performed. If the voltage is lower than the voltage which can be charged, the operation at step 305 is performed (step 306).

(2) Second Embodiment

Figure 4:
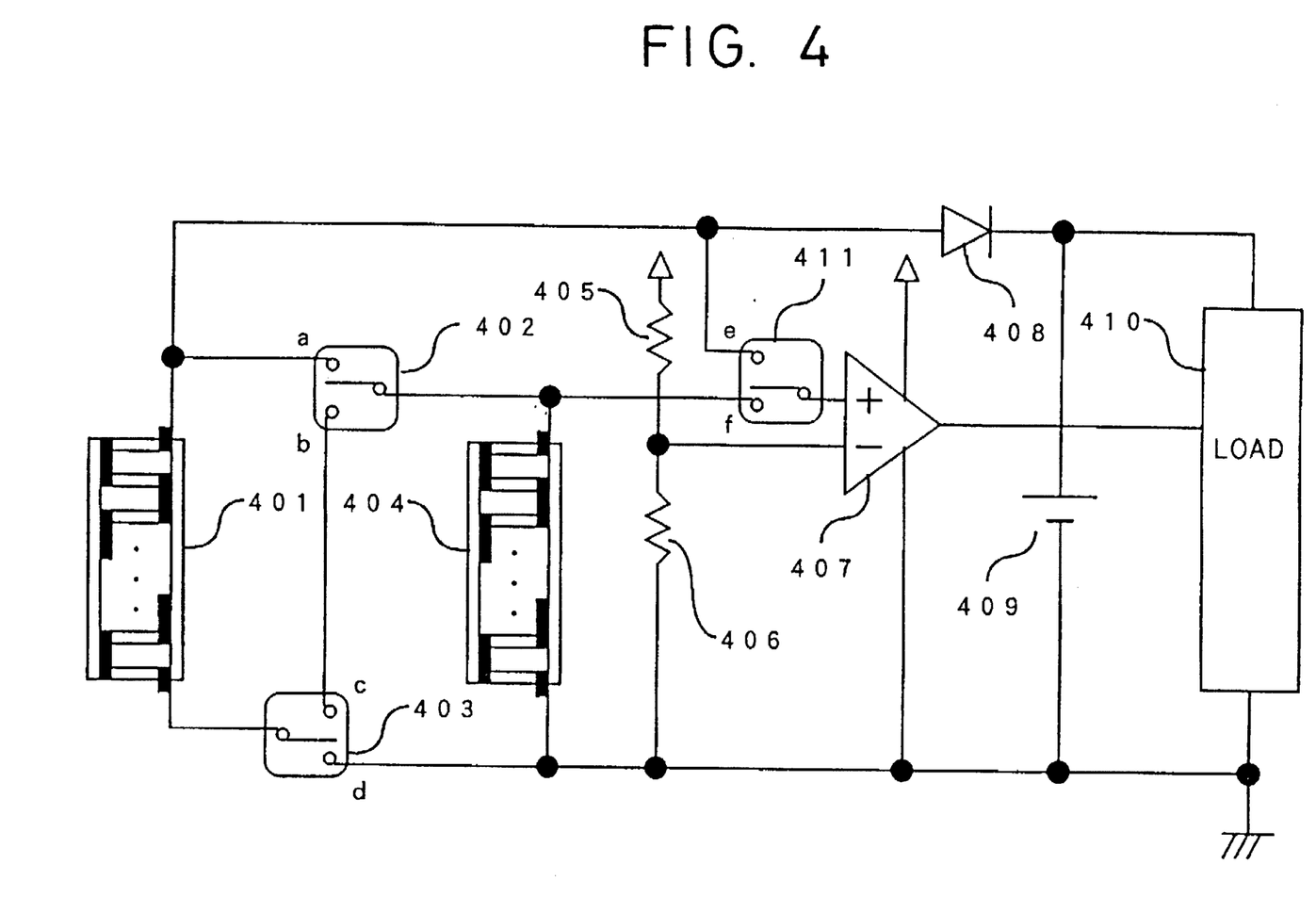
FIG. 4 is a circuit diagram showing a second embodiment of a thermoelectric module according to the present invention.

FIG. 4 shows a second embodiment of a thermoelectric module according to the present invention.

A first thermoelectric element 401 and a second thermoelectric element 404 generate a voltage in response to a temperature difference between an absorbing side and a radiating side of each thermoelectric element. These thermoelectric elements are connected to each other by switching circuits 402 and 403.

The first thermoelectric element 401 and the second thermoelectric element 404 are connected in parallel by connecting the switching circuit 402 to terminal a and switching circuit 403 to terminal d, respectively. The first thermoelectric element 401 and second thermoelectric element 404 are connected in series by connecting the switching circuit 402 to terminal b and switching circuit 403 to terminal c, respectively.

A comparator 407 compares a generated voltage by the second thermoelectric element 404 with a reference voltage generated according to the dividing ratio of resistors 405 and 406, and detects whether the thermoelectric elements can sufficiently charge a secondary battery 409 by connecting a switching circuit 411 to terminal f when the first thermoelectric element 401 and second thermoelectric element 404 are connected in parallel by the switching circuits 402 and 403.

If the first thermoelectric element 401 and second thermoelectric element 404 are connected in series by the switching circuits 402 and 403, the comparator 407 compares a generated voltage by the first thermoelectric element 401 and second thermoelectric element 404 connected in series with the reference voltage, and detects whether the thermoelectric elements can sufficiently charge a secondary battery 409 by connecting the switching circuit 411 to terminal e.

The secondary battery 409 stores the voltage generated by the first thermoelectric element 401 and second thermoelectric element 404 through a reverse-flow blocking diode 408, and supplies an electric power to a load 410.

The switching circuits 402, 403 and 411 and the comparator 407 are controlled by a microcomputer included in the load 410. The operation of the microcomputer is illustrated in the flow chart shown in FIG. 5.

Figure 5:
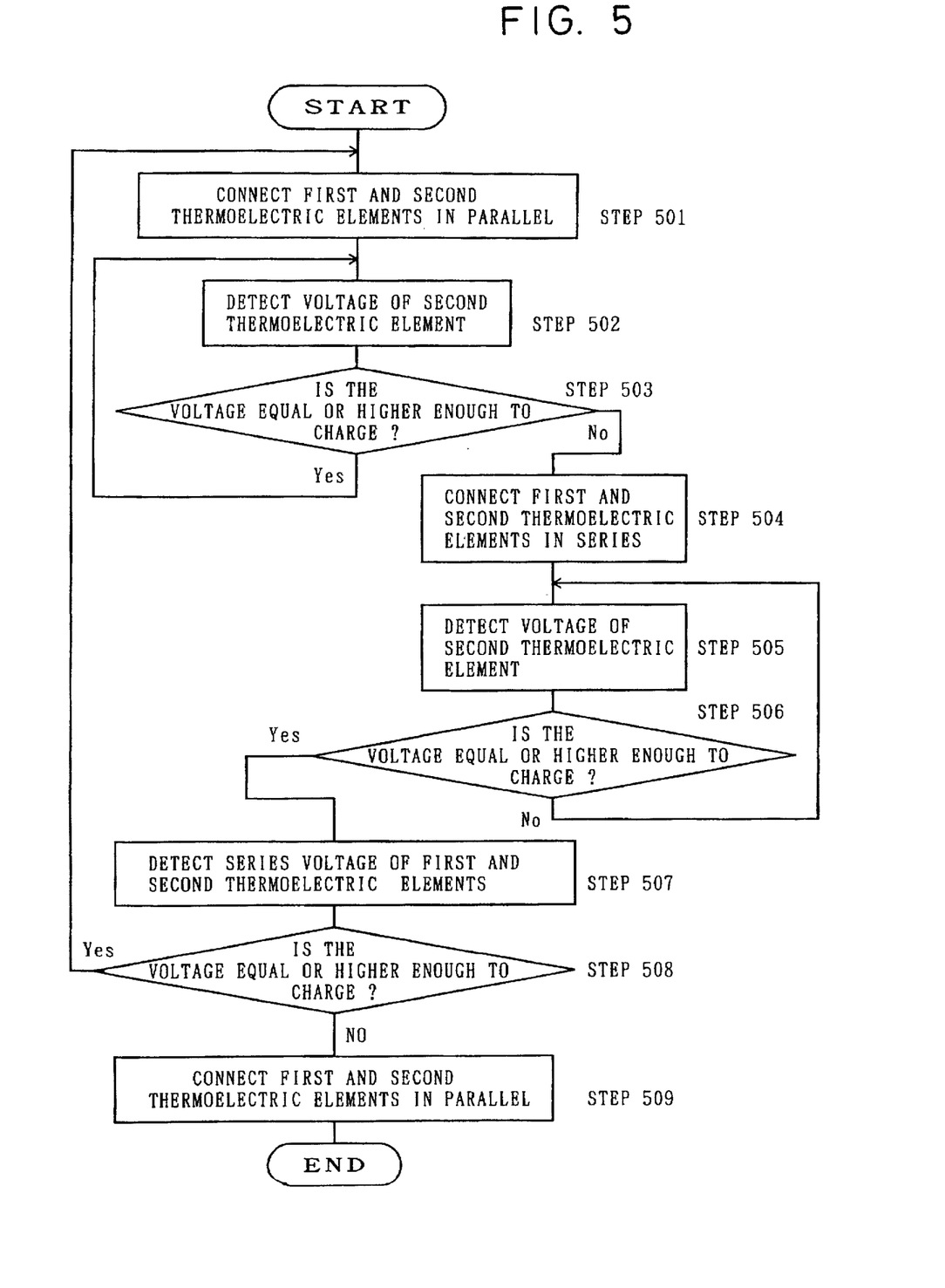
FIG. 5 is a flow chart showing the second embodiment of a thermoelectric module according to the present invention.

The first thermoelectric element and second thermoelectric element are connected in parallel by the switching circuits (step 501).

The voltage of the second thermoelectric element is detected (step 502).

If the voltage of the second thermoelectric element is equal to or higher than the voltage which can be charged in the secondary battery, the operation at step 502 is performed. If the voltage is lower than the voltage which can be charged, the operation at step 504 is performed (step 503).

If the voltage of the second thermoelectric element is lower than the voltage which can be charged in the secondary battery, the first thermoelectric element and second thermoelectric element are connected in series by the switching circuits (step 504).

The voltage of the second thermoelectric element is detected (step 505).

If the voltage of the second thermoelectric element is equal to or higher than the voltage which can be charged in the secondary battery, the operation at step 507 is performed. If the voltage is lower than the voltage which can be charged, the operation at step 505 is performed (step 506).

If the voltage of the second thermoelectric element is equal to or higher than the voltage which can be charged in the secondary battery, the series voltage of the first thermoelectric element and second thermoelectric element is detected (step 507).

If the series voltage of the first thermoelectric element and second thermoelectric element is equal to or higher than the voltage which can be charged in the secondary battery, the operation at step 501 is performed. If the voltage is lower than the voltage which can be charged, the operation at step 509 is performed (step 508).

If the series voltage of the first thermoelectric element and second thermoelectric element is lower than the voltage which can be charged in the secondary battery, it can be determined that the first thermoelectric element is broken. Then, the first thermoelectric element and second thermoelectric element are connected in parallel by the switching circuits (step 509).

(3) Third Embodiment

Figure 6:
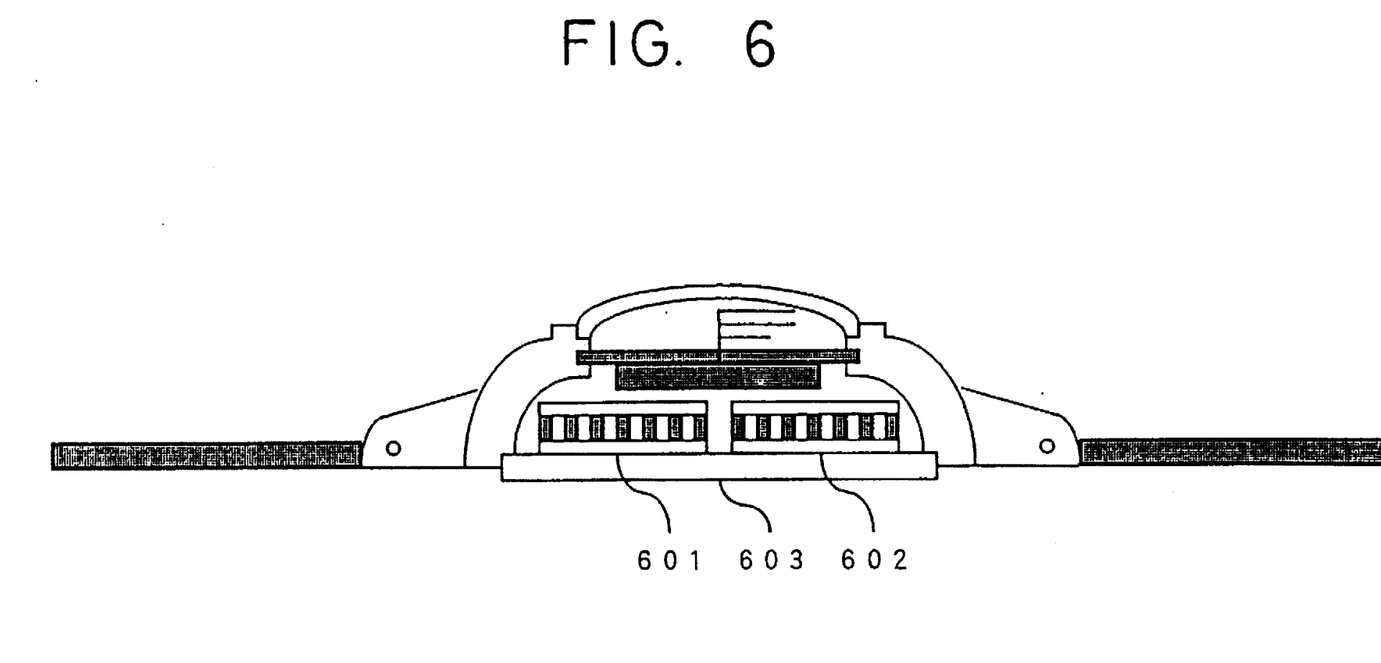
FIG. 6 is a sectional view showing an electronic watch incorporating a thermoelectric module according to the present invention.

FIG. 6 is a sectional view showing an electronic watch incorporating a thermoelectric module according to the present invention. A first thermoelectric element 601 and a second thermoelectric element 602 are disposed on a back plate 603.

When attached to an arm of the user, the back plate 603 serves as a heat sink coupling to an absorbing side of the internal thermoelectric elements 601 and 602 to generate electricity utilizing a temperature difference. Further, since the first thermoelectric element 601 and the second thermoelectric element 602 are disposed inside the watch case, they will not degrade the appearance of the watch and place less restriction on the design of the watch.

Figure 7:
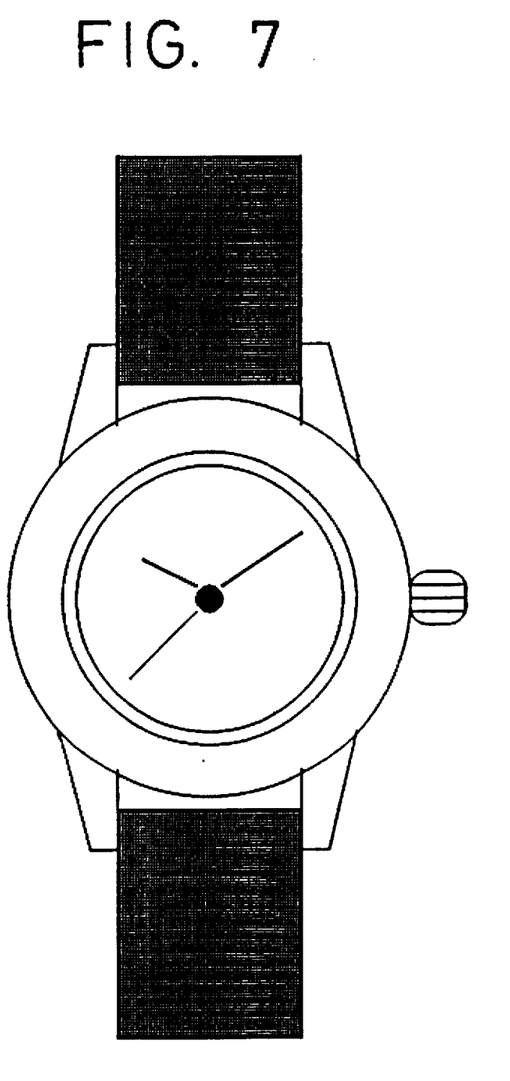
FIG. 7 is an outside view of an electronic watch incorporating a thermoelectric module according to the present invention.

FIG. 7 is an outside view of the electronic watch incorporating the thermoelectric module according to the present invention.

As described above, the present invention provides an advantage that a generated electricity can be always efficiently charged in a storage battery circuit by connecting a plurality of thermoelectric elements in series or in parallel in response to the detection of a voltage generated from an applied temperature difference using the plurality of thermoelectric elements.

What is claimed is:

1. A thermoelectric module comprising: a first thermoelectric element for generating an electromotive force in response to a temperature difference thereacross; a second thermoelectric element for generating an electromotive force in response to a temperature difference thereacross; a switching circuit for switching an electrical connection between the first thermoelectric element and the second thermoelectric element between a series connection and a parallel connection; a voltage detecting circuit for detecting a voltage of the second thermoelectric element and controlling the switching circuit in accordance therewith; and a storage battery circuit electrically connected to the first thermoelectric element and the second thermoelectric element via the switching circuit for storing electricity utilizing the electromotive forces generated by the first thermoelectric element and the second thermoelectric element.

2. A thermoelectric module according to claim 1; wherein the switching circuit includes at least one switch element for connecting the first thermoelectric element and the second thermoelectric element in parallel when the voltage generated by the second thermoelectric element is equal to or higher than a voltage which is to be applied to charge the storage battery circuit; and the switching circuit includes at least one switch element for connecting the first thermoelectric element and the second thermoelectric element in series when the voltage generated by the second thermoelectric element is lower than the voltage which is to be applied to charge the storage battery circuit.

3. A thermoelectric module according to claim 1; wherein the first and second thermoelectric elements each comprise a plurality of alternating n-type and p-type series-connected semiconductor members, and at least one insulating plate supporting the series-connected semiconductor members.

4. A thermoelectric module according to claim 1; wherein the first and second thermoelectric elements each comprise a plurality of alternating n-type and p-type series-connected semiconductor members, a first insulator disposed on a first side of the series-connected semiconductor members, a radiator for radiating heat disposed on the first insulator, a second insulator disposed on a second side of the series-connected semiconductor members opposing the first side, and a heat sink for absorbing heat disposed on the second insulator, such that an electric current is generated in the series-connected semiconductor members in response to a temperature gradient applied across the thermoelectric element between the radiator and the heat sink.

5. A thermoelectric module according to claim 1; wherein the voltage detecting circuit comprises a comparator for comparing the voltage of the second thermoelectric element with a reference voltage level, the reference voltage level being set to a voltage which is to be applied to charge the storage battery circuit.

6. A thermoelectric module according to claim 5; wherein the voltage detecting circuit further includes a control circuit having a microcomputer connected to the voltage detecting circuit and contained in a load circuit driven by the storage battery circuit.

7. A thermoelectric module according to claim 5; wherein the voltage detecting circuit further includes a control circuit having a microcomputer connected to the voltage detecting circuit, the microcomputer having means for controlling the switching circuit to connect the first and second thermoelectric elements in parallel, determining whether the detected voltage of the second thermoelectric element is greater than the reference voltage level which is to be applied to charge the storage battery circuit, and controlling the switching circuit to connect the first and second thermoelectric elements in series when the detected voltage is lower than the reference voltage level.

8. An electronic timepiece with a thermoelectric module, comprising: a first thermoelectric element for generating an electromotive force in response to a temperature difference thereacross; a second thermoelectric element for generating an electromotive force in response to a temperature difference thereacross; a switching circuit for switching an electrical connection between the first thermoelectric element and the second thermoelectric element between a series connection and a parallel connection; a voltage detecting circuit for detecting a voltage of the second thermoelectric element and controlling the switching circuit in accordance therewith; a storage battery circuit electrically connected to the first thermoelectric element and the second thermoelectric element via the switching circuit for storing electricity utilizing the electromotive forces generated by the first thermoelectric element and the second thermoelectric element; an oscillation circuit connected to be driven by electrical energy stored in the storage battery circuit; a dividing circuit for frequency-dividing a signal output by the oscillation circuit; a time counting circuit for counting time based on an output signal from the dividing circuit; and a display mechanism for displaying time information counted by the time counting circuit.

9. A thermoelectric module according to claim 8; wherein the first and second thermoelectric elements each comprise a plurality of alternating n-type and p-type series-connected semiconductor members, and at least one insulating plate supporting the series-connected semiconductor members.

10. A thermoelectric module according to claim 8; wherein the first and second thermoelectric elements each comprise a plurality of alternating n-type and p-type series-connected semiconductor members, a first insulator disposed on a first side of the series-connected semiconductor members, a radiator for radiating heat disposed on the first insulator, a second insulator disposed on a second side of the series-connected semiconductor members opposing the first side, and a heat sink for absorbing heat disposed on the second insulator, such that an electric current is generated in the series-connected semiconductor members in response to a temperature gradient applied across the thermoelectric element between the radiator and the heat sink.

11. A thermoelectric module according to claim 8; wherein the voltage detecting circuit comprises a comparator for comparing the voltage of the second thermoelectric element with a reference voltage level, the reference voltage level being set to a voltage which is to be applied to charge the storage battery circuit.

12. A thermoelectric module according to claim 11; wherein the voltage detecting circuit further includes a control circuit having a microcomputer connected to the voltage detecting circuit and contained in a load driven by the storage battery circuit.

13. A thermoelectric module according to claim 11; wherein the voltage detecting circuit further includes a control circuit having a microcomputer connected to the voltage detecting circuit, the microcomputer having means for controlling the switching circuit to connect the first and second thermoelectric elements in parallel, determining whether the detected voltage of the second thermoelectric element is greater than the reference voltage level which is to be applied to charge the storage battery circuit, and controlling the switching circuit to connect the first and second thermoelectric elements in series when the detected voltage is lower than the reference voltage level.

14. A thermoelectric module comprising: a first thermoelectric element for generating an electromotive force in response to a temperature difference thereacross; a second thermoelectric element for generating an electromotive force in response to a temperature difference thereacross; a switching circuit for alternately connecting the first and second thermoelectric elements in one of a series connection and a parallel connection; a voltage detecting circuit for detecting a voltage output by at least one of the interconnected thermoelectric elements; a control circuit for controlling the switching circuit in accordance with the detected voltage; and an energy storage circuit including an energy storage element for storing energy generated by the first and second thermoelectric elements.

15. A thermoelectric module according to claim 14; wherein the control circuit is responsive to the detected voltage to control the switching circuit to connect the first thermoelectric element and the second thermoelectric element in parallel when the detected voltage is equal to or greater than a voltage which is to be applied to charge the energy storage element, and to connect the first thermoelectric element and the second thermoelectric element in series when the detected voltage is lower than the voltage which is to be applied to charge the energy storage element.

16. A thermoelectric module according to claim 14; wherein the energy storage element comprises a battery for driving a load.

17. A thermoelectric module according to claim 14; wherein the control circuit comprises a microcomputer connected to the voltage detecting circuit and contained in a load driven by the energy storage element.

18. A thermoelectric module according to claim 14; wherein the first and second thermoelectric elements each comprise a plurality of alternating n-type and p-type series-connected semiconductor members, a first insulator disposed on a first side of the series-connected semiconductor members, a radiator for radiating heat disposed on the first insulator, a second insulator disposed on a second side of the series-connected semiconductor members opposing the first side, and a heat sink for absorbing heat disposed on the second insulator, such that an electric current is generated in the series-connected semiconductor members in response to a temperature gradient applied across the thermoelectric element between the radiator and the heat sink.

19. An electronic timepiece having an oscillation circuit for generating a time standard, a dividing circuit for frequency-dividing the time standard and producing a divided output signal, a time counting circuit for counting elapsed time based on the divided output signal, and a display mechanism for displaying the elapsed time counted by the time counting circuit; wherein the oscillation circuit is driven by a thermoelectric module according to claim 14.

20. An electronic watch having a case having a backplate configured to be worn on the wrist of a user, an oscillation circuit for generating a time standard, a divider circuit for frequency-dividing the time standard and producing a divided output signal, a time counting circuit for counting elapsed time based on the divided output signal, and a display mechanism for displaying the elapsed time counted by the time counting circuit; wherein the oscillation circuit is driven by a thermoelectric module according to claim 14, and the first and second thermoelectric elements are arranged adjacent to the backplate of the watch such that a temperature difference is applied across the thermoelectric elements by heat output from the user's wrist.

21. A thermoelectric module comprising: a plurality of thermoelectric elements each for generating an electromotive force in response to a temperature difference thereacross; a switching circuit for electrically connecting two or more of the thermoelectric elements in one of a series connection and a parallel connection; a voltage detecting circuit for detecting a voltage output by at least one of the interconnected thermoelectric elements; a control circuit for controlling the switching circuit in accordance with the detected voltage; and an energy storage circuit including an energy storage element for storing energy generated by the first and second thermoelectric elements.

* * * * *